(12) United States Patent
Seghizzi et al.

(10) Patent No.: US 11,839,159 B2
(45) Date of Patent: Dec. 5, 2023

(54) TRANSDUCER WITH IMPROVED PIEZOELECTRIC ARRANGEMENT, MEMS DEVICE COMPRISING THE TRANSDUCER, AND METHODS FOR MANUFACTURING THE TRANSDUCER

(71) Applicant: STMicroelectronics S.r.l., Agrate Brianza (IT)

(72) Inventors: Luca Seghizzi, Milan (IT); Federico Vercesi, Milan (IT); Claudia Pedrini, Seriate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 286 days.

(21) Appl. No.: 17/070,548

(22) Filed: Oct. 14, 2020

(65) Prior Publication Data

US 2021/0119105 A1   Apr. 22, 2021

(30) Foreign Application Priority Data

Oct. 16, 2019   (IT) ......................... 102019000019058

(51) Int. Cl.
| | |
|---|---|
| *H01L 41/083* | (2006.01) |
| *H10N 30/50* | (2023.01) |
| *H10N 30/03* | (2023.01) |
| *H10N 30/09* | (2023.01) |
| *H10N 30/30* | (2023.01) |

(52) U.S. Cl.
CPC ............. *H10N 30/50* (2023.02); *H10N 30/03* (2023.02); *H10N 30/09* (2023.02); *H10N 30/306* (2023.02)

(58) Field of Classification Search
CPC ... H01L 41/083; H01L 41/1136; H10N 30/50; H10N 30/306
See application file for complete search history.

(56) References Cited

U.S. PATENT DOCUMENTS

| | | | |
|---|---|---|---|
| 9,705,067 B2 * | 7/2017 | Tanaka | H10N 30/2042 |
| 2002/0175597 A1 * | 11/2002 | Raman | H10N 30/00 |
| | | | 310/330 |
| 2010/0047092 A1 * | 2/2010 | Erturk | F04D 33/00 |
| | | | 417/410.2 |
| 2014/0175948 A1 * | 6/2014 | Tanaka | F04D 33/00 |
| | | | 310/330 |

(Continued)

FOREIGN PATENT DOCUMENTS

| | | |
|---|---|---|
| CN | 101499271 A | 8/2009 |
| CN | 102138338 A | 7/2011 |

(Continued)

OTHER PUBLICATIONS

English Translation of WO2014180571 Schulzo (Year: 2014).*

*Primary Examiner* — Bryan P Gordon
(74) *Attorney, Agent, or Firm* — SEED IP LAW GROUP LLP

(57) ABSTRACT

A transducer includes a supporting body and a suspended structure mechanically coupled to the supporting body. The suspended structure has a first and a second surface opposite to one another along an axis, and is configured to oscillate in an oscillation direction having at least one component parallel to the axis. A first piezoelectric transducer is disposed on the first surface of the suspended structure, and a second piezoelectric transducer is disposed on the second surface of the suspended structure.

20 Claims, 13 Drawing Sheets

(56) References Cited

U.S. PATENT DOCUMENTS

2015/0350792 A1* 12/2015 Grosh .................... H04R 17/02
                                                              257/416
2018/0123017 A1   5/2018 Fujii et al.

FOREIGN PATENT DOCUMENTS

| CN | 214154836 U      | 9/2021  |
|----|------------------|---------|
| DE | 10 2013 009 715 A1 | 11/2014 |
| DE | 102017200108 A1  | 7/2018  |
| JP | 2007-36612 A     | 2/2007  |
| JP | 2017-130701 A    | 7/2017  |

* cited by examiner

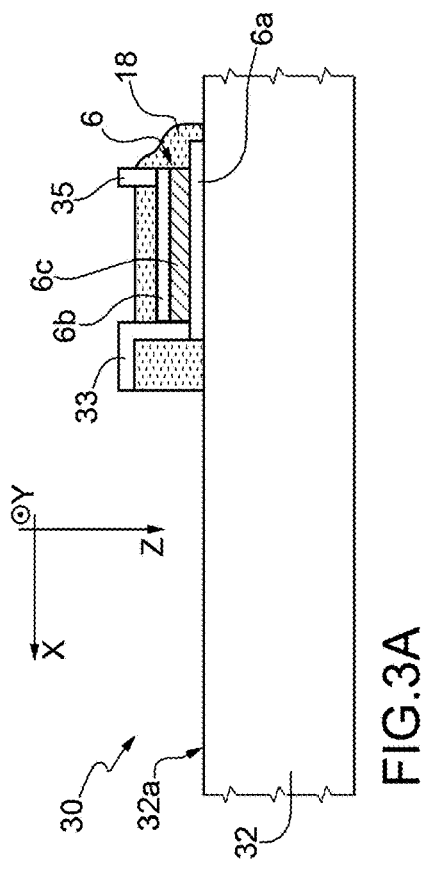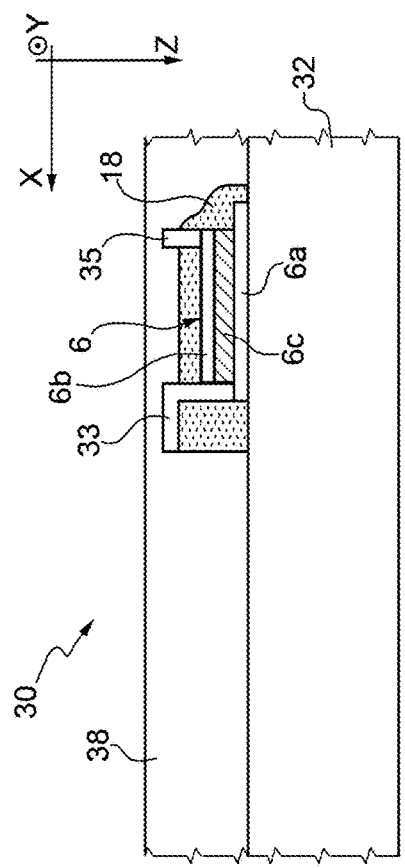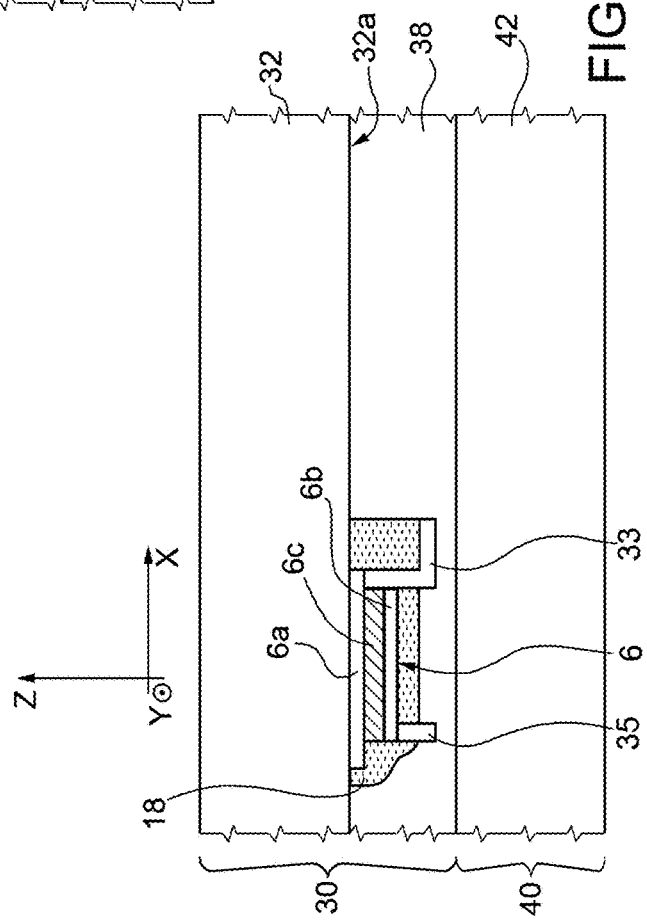

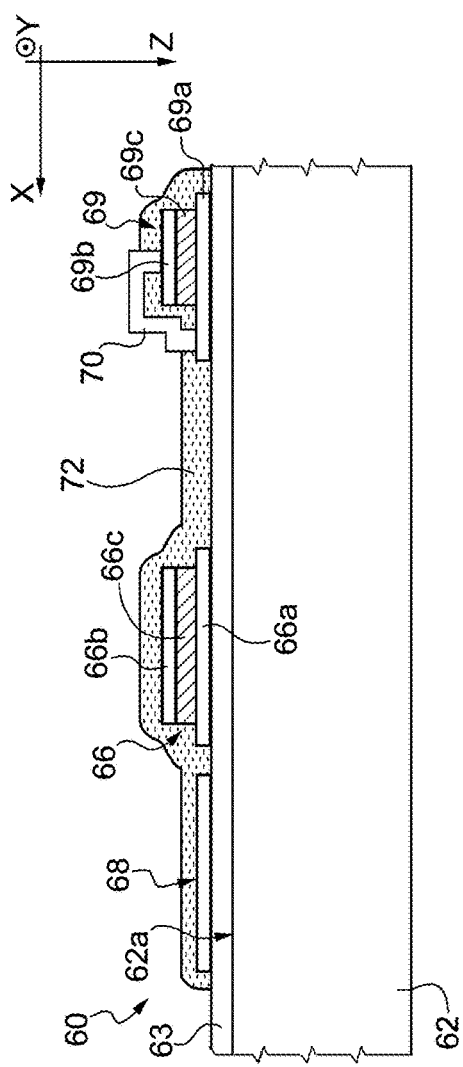
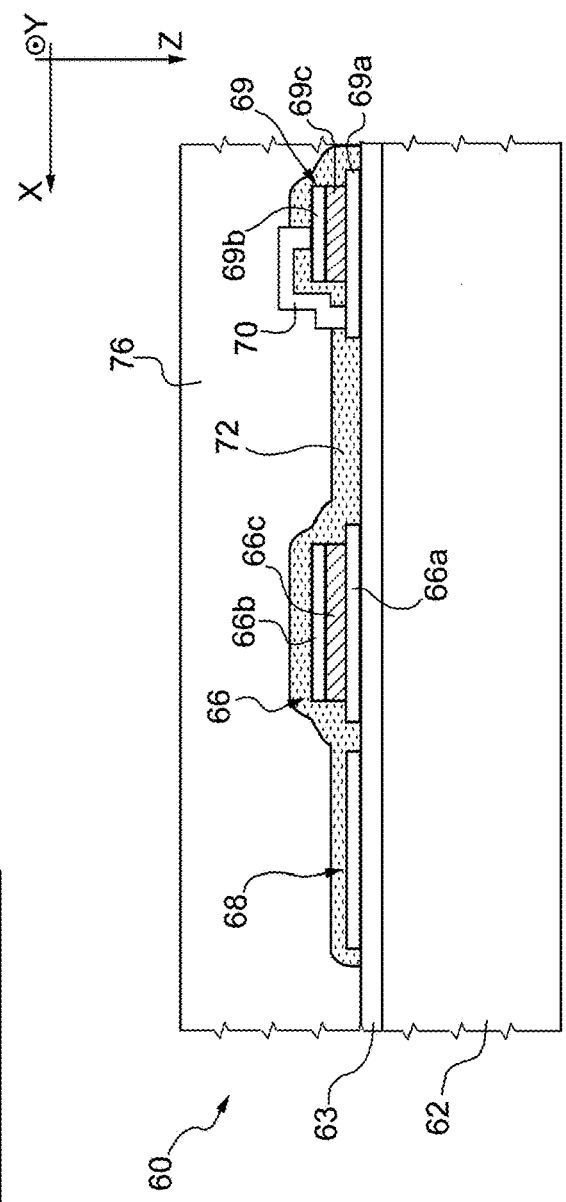
FIG.5A
FIG.5B

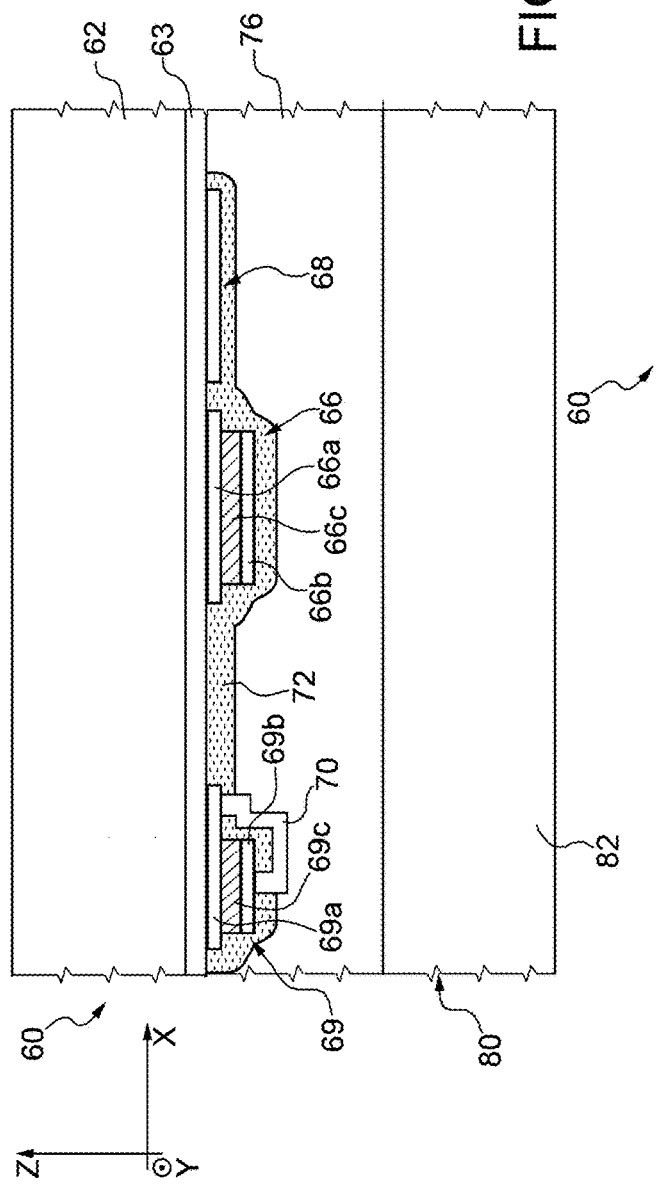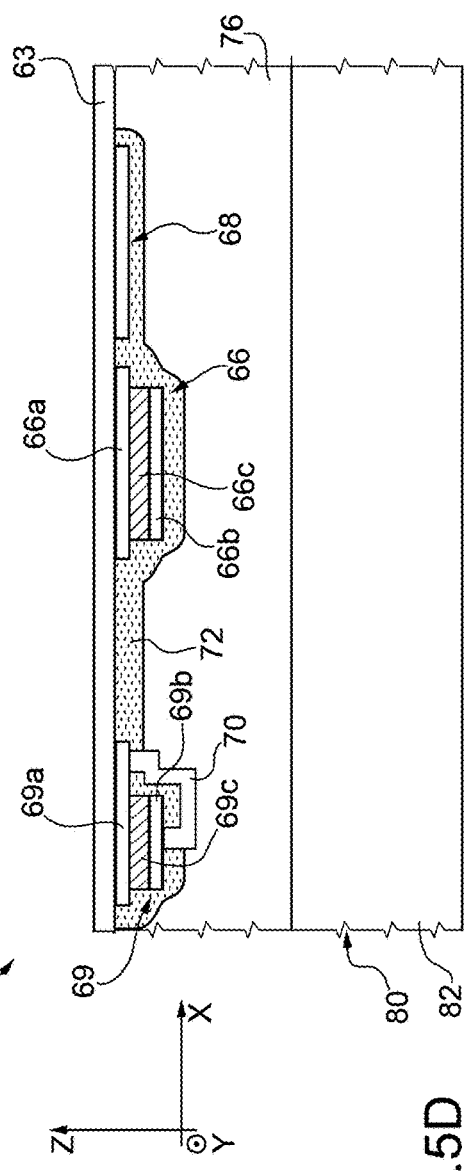

TRANSDUCER WITH IMPROVED PIEZOELECTRIC ARRANGEMENT, MEMS DEVICE COMPRISING THE TRANSDUCER, AND METHODS FOR MANUFACTURING THE TRANSDUCER

BACKGROUND

Technical Field

The present disclosure relates to a transducer, a MEMS device comprising the transducer, and methods for manufacturing the transducer. In particular, the present disclosure regards a transducer with improved piezoelectric arrangement, which enables advanced functions.

Description of the Related Art

As is known, a wide range of devices use a membrane (or cantilever) structure as actuator and/or transducer, for emitting a signal or acquiring information from a signal received.

Actuation of the membrane is typically carried out by an actuator of a piezoelectric type, which, when driven by an appropriate signal, imparts on the membrane a controlled deformation. Likewise, transduction of a signal received is carried out by generation of an electrical signal that is a function of the spatial displacement or deflection of the membrane.

It may happen that, on account of residual tensile or compressive stresses in the materials that form the membrane, the latter is, at the end of the manufacturing steps, not perfectly planar. The membrane presents, in this case, a deflection or warping that might adversely affect proper operation thereof, both during actuation and during detection (e.g., on account of a reduction of the travel allowed).

Similar considerations apply to cantilever structures and, in general, to micromachined suspended structures.

It is known to adjust warping or deflection of such suspended structures by appropriately designing the stress generated by the layers that form the suspended structures in order to obtain balancing of the compressive and tensile stresses. These solutions are, however, not always applicable, on account of the limited degree of deflection that it is possible to compensate and on account of the complexity of the method, which markedly depends upon the manufacturing conditions (that are not always foreseeable beforehand). Compatibility of such methods with the structures already present on the wafer being machined is a further aspect to be taken into consideration.

On the other hand, an excessive residual stress may cause problems of reliability of the corresponding suspended structure, amongst which failure thereof and hindrance to a proper or desired movement.

There is consequently felt the need to overcome the above drawbacks.

BRIEF SUMMARY

In various embodiments, the present disclosure provides a transducer, a MEMS device comprising the transducer, and methods for manufacturing the transducer, that will be able to overcome the aforesaid disadvantages.

According to the present disclosure, a transducer, a MEMS device comprising the transducer, and methods for manufacturing the transducer are therefore provided.

In one or more embodiments, a transducer is provided that includes a supporting body and a suspended structure mechanically coupled to the supporting body. The suspended structure has a first and a second surface opposite to one another along an axis, and is configured to oscillate along an oscillation direction having at least one component parallel to the axis. A first piezoelectric transducer is on the first surface of the suspended structure, and a second piezoelectric transducer is on the second surface of the suspended structure.

In one or more embodiments, a MEMS device is provided that includes at least one transducer. The at least one transducer includes a supporting body and a suspended structure mechanically coupled to the supporting body. The suspended structure has a first and a second surface opposite to one another along an axis, and is configured to oscillate along an oscillation direction having at least one component parallel to the axis. A first piezoelectric transducer is on the first surface of the suspended structure, and a second piezoelectric transducer is on the second surface of the suspended structure.

In one or more embodiments, a method for manufacturing a transducer is provided that includes: forming, on a supporting body, a suspended structure having a first and a second surface opposite to one another along an axis, and configured to oscillate in an oscillation direction having at least one component parallel to the axis; forming, on the first surface of the suspended structure, a first piezoelectric transducer; and forming, on the second surface of the suspended structure, a second piezoelectric transducer.

BRIEF DESCRIPTION OF THE SEVERAL VIEWS OF THE DRAWINGS

For an understanding of the present disclosure, preferred embodiments thereof are now described, purely by way of non-limiting example, with reference to the attached drawings, wherein:

FIGS. 3A-3G illustrate manufacturing steps for producing the transducer of FIG. 1 according to one embodiment of the present disclosure;

FIGS. 5A-5F illustrate manufacturing steps for producing the transducer of FIGS. 2A/2B according to a further embodiment of the present disclosure;

DETAILED DESCRIPTION

Figure 1:
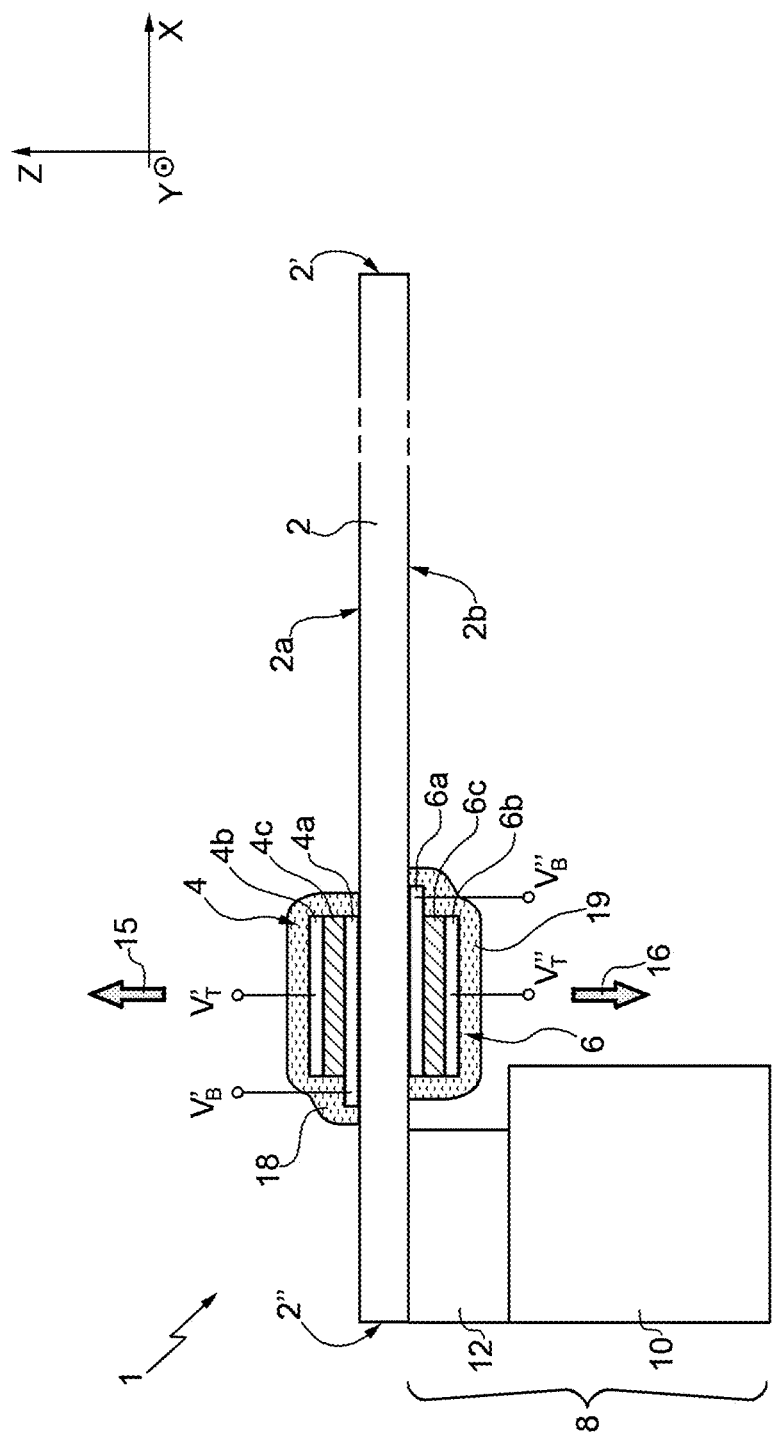
FIG. 1 is a cross-sectional view of a transducer according to one embodiment of the present disclosure.

FIG. 1 shows a side cross-sectional view of a MEMS device 1, in particular, a transducer, for a portion thereof useful for an understanding of the present disclosure, in a cartesian triaxial reference system X, Y, Z.

The device 1 is provided with a suspended structure 2 (here, a cantilever), having a major extension along the axis X, a minor extension along the axis Y, and a thickness along the axis Z. The cantilever 2 is delimited at the top by a top side 2a and at the bottom by a bottom side 2b, which are opposite to one another in the direction of the axis Z.

The cantilever 2 has a first terminal portion 2' free to move and a second terminal portion 2" constrained to a solid body 8.

The cantilever 2 is, for example, of semiconductor material (e.g., silicon), while the solid body 8 is made up of a first structural region 10, for example, of semiconductor material (e.g., silicon), and a second structural region 12 (for example, of silicon oxide), which extends over the first structural region 10. It is evident that the materials used for the cantilever 2 and for the solid body 8 are provided purely by way of example and may be chosen according to the need.

A first transducer 4 and a second transducer 6 are coupled to the cantilever 2. The first transducer 4 is coupled at the top side 2a, whereas the second transducer 6 is coupled at the bottom side 2b.

In one embodiment, the first and second transducers 4, 6 may be controlled for generating a movement of the cantilever 2 upwards and, respectively, downwards, in the directions indicated by the arrows 15 and 16 of FIG. 1. In particular, the first transducer 4 is configured to cause a deformation of the cantilever 2 upwards (i.e., in the direction of the arrow 15), whereas the second transducer 6 is configured to cause a deformation of the cantilever 2 downwards (i.e., in the direction of the arrow 16).

The first and second transducers 4, 6 are, in particular, piezoelectric transducers. The first transducer 4 includes a piezoelectric stack formed by a bottom electrode 4a, a top electrode 4b, and a piezoelectric layer 4c arranged between the top electrode 4b and the bottom electrode 4a. Likewise, the second transducer 6 includes a piezoelectric stack formed by a bottom electrode 6a, a top electrode 6b, and a piezoelectric layer 6c arranged between the top electrode 6b and the bottom electrode 6a. The first and second transducers 4, 6 are coupled to the cantilever 2 by the respective bottom electrodes 4a, 6a. A passivation layer 18 (for example, of oxide or dielectric) covers the piezoelectric stack of the first transducer 4 to insulate it electrically from the external environment and protect it from any possible damage. A passivation layer 19 (for example, of oxide or dielectric) covers the piezoelectric stack of the second transducer 6 to insulate it electrically from the external environment and protect it from any possible damage.

The electrodes 4a, 4b, 6a, 6b can be biased, in use, through conductive paths (not illustrated in detail in FIG. 1) in order to bias them at working voltages ($V_{B'}$, $V_{T1'}$ for the first transducer 4; $V_{B''}$, $V_{T''}$ for the second transducer 6) such as to generate the desired deflection, or deformation, of the cantilever 2. The choice of the working voltages depends upon the particular application, upon the materials used for the cantilever 2 (which define the stiffness thereof), and in general upon design specifications, which do not regard the context of the present disclosure.

The embodiment of FIG. 1 enables driving of the transducers 4 and 6 simultaneously or alternatively to move the cantilever 2 as desired. For instance, if they are driven alternatively with respect to one another, it is possible to deflect the cantilever 2 in two directions: upwards, in the direction indicated by the arrow 15; and downwards, in the direction indicated by the arrow 16. Instead, if they are driven simultaneously, it is possible to balance or compensate, by one of the transducers 4 and 6, a possible residual stress of the cantilever 2, and deflect the cantilever 2 by the other one of the transducers 4 and 6.

Figure 2A:
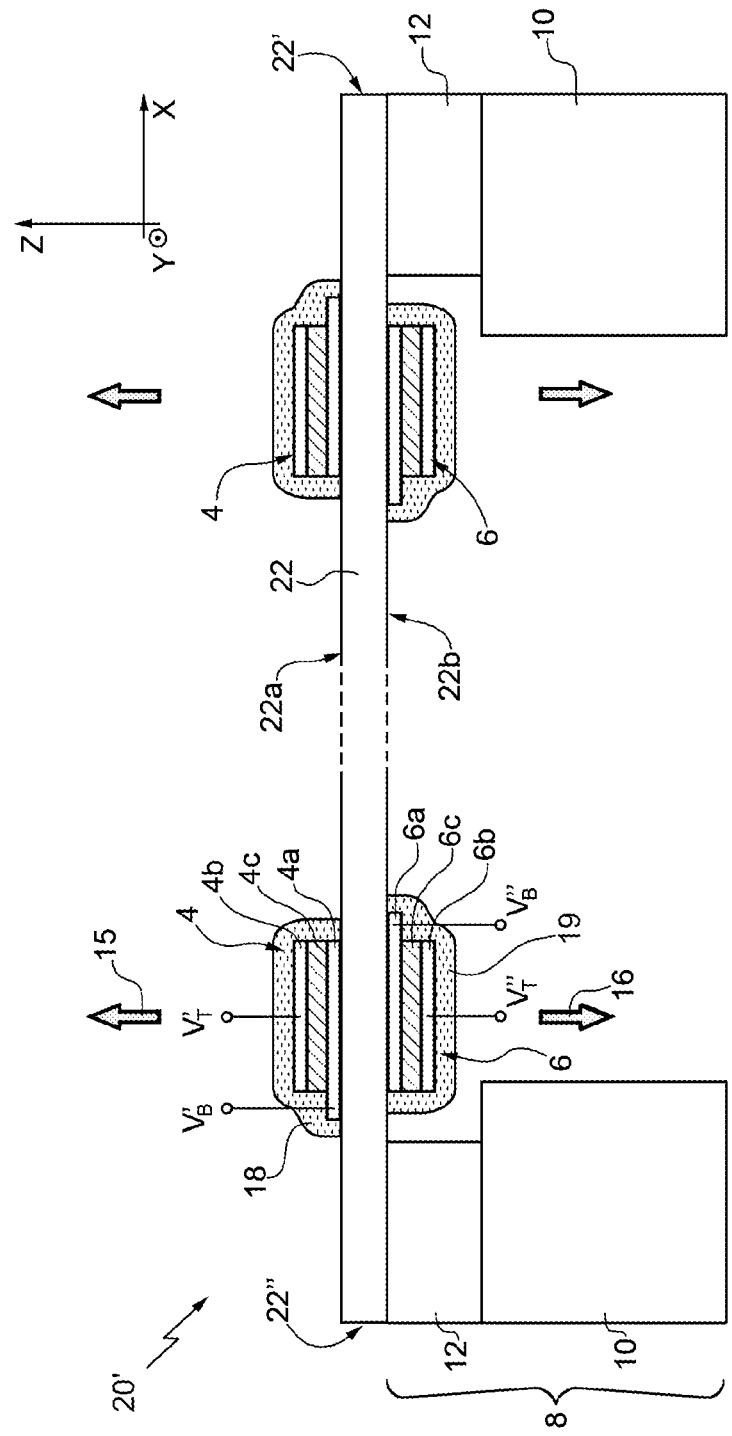
FIG. 2A is a cross-sectional view of a transducer according to a further embodiment of the present disclosure.

FIG. 2A illustrates a further embodiment of a device 20' according to one aspect of the present disclosure. Elements that are in common with those of FIG. 1 are designated by the same reference numbers and are not described any further.

In this case, the suspended structure is a membrane 22, which extends (ideally, in the absence of stress) parallel to the plane XY (plane of lie of the membrane 22), has a thickness in the direction Z, and has a top side 22a opposite (along Z) to a bottom side 22b. Even though not illustrated in the figure, the membrane 22 may be perforated, according to the need and according to the technical application in which the device 20' is to be used.

The membrane 22 is constrained in a number of points to the solid body 8, for example at ends 22' and 22" forming part of a perimetral region, or edge region, of the membrane 22. It is evident that this is only an embodiment provided purely by way of example, and the membrane 22 may be constrained along its entire perimeter or else in some regions (not adjacent to one another) of the perimeter, or in some other way still.

The device 20' comprises the first and second transducers 4, 6, already described with reference to FIG. 1.

Figure 6A:
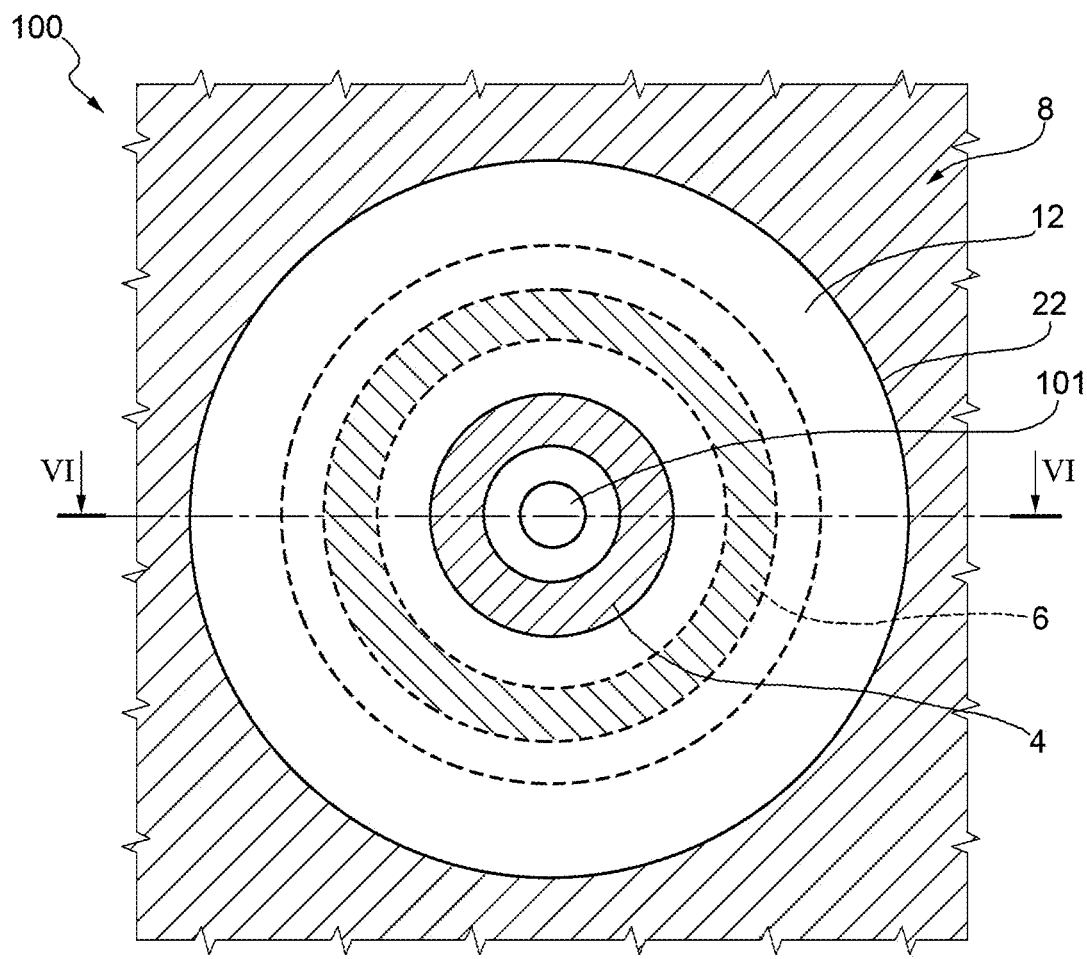
FIGS. 6A and 6B illustrate, in top view and in cross-sectional view, respectively, a Piezoelectric Micromachined Ultrasonic Transducer (PMUT) including a transducer of the type illustrated in FIG. 2A.

In this embodiment, the first and second transducers 4, 6 have a shape, in top view in the plane XY, that is circular (for example, as illustrated in FIG. 6A), in particular with their center coinciding with the geometrical center of the suspended structure.

Figure 2B:
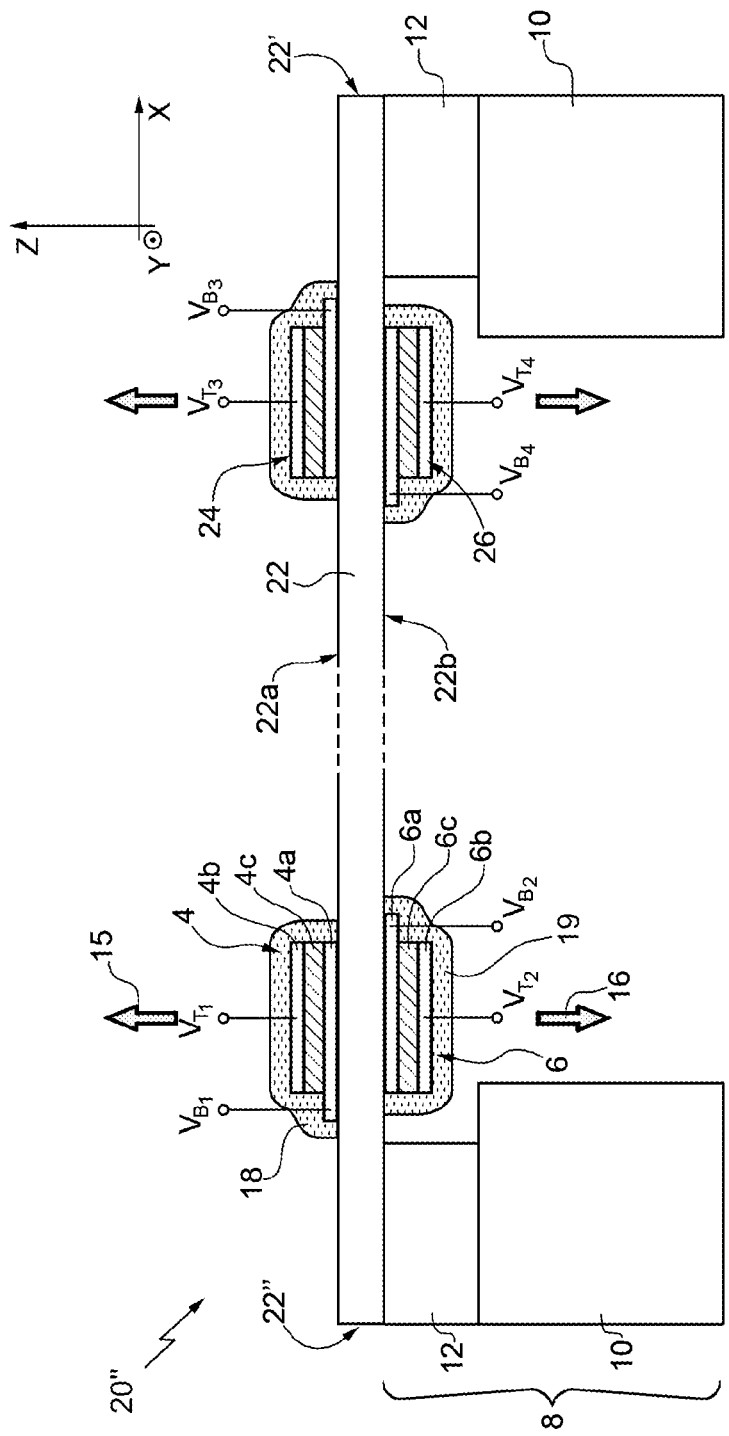
FIG. 2B is a cross-sectional view of a transducer according to yet a further embodiment of the present disclosure.

FIG. 2B, which includes all the elements described with reference to FIG. 2A, illustrates a further embodiment of a device 20", in which the first and second transducers 4, 6 do not have a circular shape. The device 20" further comprises a third transducer 24 and a fourth transducer 26. The third transducer 24 corresponds, as regards structure, materials, and operation, to the first transducer 4. The fourth transducer 26 corresponds, as regards structure, materials, and operation, to the second transducer 6. The first and third transducers 4, 24 are coupled at the top side 22a of the membrane 22, whereas the second and fourth transducers 6, 26 are coupled at the bottom side 22b of the membrane 22.

The first and second transducers 4, 6 are arranged in the proximity of the end 22' (as in FIG. 1), whereas the third and fourth transducers 24, 26 are arranged in the proximity of the end 22".

In one embodiment, the first and third transducers 4, 24 are specular with respect to one another relative to a first plane passing through the geometrical center of the membrane 22 and orthogonal to the plane of lie of the membrane 22 (here, XY). Likewise, also the second and fourth transducers 6, 26 are specular with respect to one another relative to a second plane passing through the geometrical center of the membrane 22 and orthogonal to the plane of lie of the membrane 22. The second plane may or not coincide with the first plane, on the basis of considerations deriving from the specific application that do not form the subject of the present disclosure.

Moreover, in the embodiment of FIG. 2B, the first and third transducers 4, 24 are specular with respect to one another relative to the plane of lie of the membrane 22. Likewise, also the second and fourth transducers 6, 26 are specular with respect to one another relative to the plane of lie of the membrane 22.

In general, however, the first and third transducers 4, 24 may not be specular with respect to one another relative to the plane of lie of the membrane 22, and likewise also the second and fourth transducers 6, 26.

In use, the first, second, third, and fourth transducers 4, 6, 24, 26 may be biased with operating voltages (respectively: $V_{B1}$, $V_{T1}$; $V_{B2}$, $V_{T2}$; $V_{B3}$, $V_{T3}$; $V_{B4}$, $V_{T4}$) equal to one another or different from one another, or equal in pairs (e.g., the same voltage for the first and third transducers; the same voltage for the second and fourth transducers).

Embodiments for manufacturing the device 1 of FIG. 1 are now described (limitedly to what is necessary for an understanding of the present disclosure). What is described applies, in a way in itself evident to the person skilled in the art, to manufacture of the device 20' of FIG. 2A and of the device 20" of FIG. 2B.

First Embodiment (Manufacturing Method)

Reference is made to FIGS. 3A-3G. The reference numbers used in FIGS. 3A-3G correspond to the ones already used in FIG. 1, where said reference numbers identify elements common to those of FIG. 1.

With reference to FIG. 3A, formed on a top surface 32a of a substrate 32 belonging to a semiconductor wafer 30 (illustrated only for a portion useful for an understanding of the present disclosure), is the piezoelectric stack 6.

Formation of the second transducer 6 includes formation a piezoelectric stack as described hereinafter.

First of all, formed on the top surface 32a of the substrate 32 is the bottom electrode 6a (for example, obtained starting from an optional layer of AlN having the function of seeding layer with a thickness comprised between 10 nm and 60 nm), including a layer of a first conductive material with a thickness comprised between 50 nm and 250 nm.

This is followed by deposition of the piezoelectric layer 6c on the bottom electrode 6a, in particular by depositing a layer of PZT (Pb, Zr, $TiO_3$), having a thickness comprised between 0.3 µm and 3.0 µm, typically 2 µm. The piezoelectric layer 6c may alternatively be of aluminum nitride (AlN), AlNSc (scandium-doped AlN), or some other material with piezoelectric characteristics.

Next, deposited on the piezoelectric layer 6c is a second conductive material, having a thickness comprised between 50 nm and 250 nm, to form the top electrode 6b. The materials that can be used to form the top and bottom electrodes 6b, 6a include, but are not limited to, Mo, Pt, TiPt, LNO, Al, TiW, Ir, $IrO_2$, ITO, $RuO_2$, TiW—Ir, $ZrO_2$.

To define the geometries desired for the electrode layers 6a, 6b and the piezoelectric layer 6c, these layers are deposited and subjected to lithographic and etching steps, in order to pattern them as desired, in a way not illustrated in detail in the figures in so far as it is in itself evident to the person skilled in the art.

One or more passivation layers are then formed on the stack of the first actuator 6 to form the passivation layer 18. Said one or more passivation layers include one or more of from among dielectric materials, oxides, nitrides, carbides (e.g., $SiO_2$ or SiN or $Al_2O_3$, etc.) having a thickness comprised, for example, between 0.1 µm and 3 µm. The passivation layers are then etched in selective regions to create access trenches towards the bottom electrode 6a and the top electrode 6c. This is followed by a step of deposition of conductive material, such as metal (e.g., aluminum or else gold, possibly together with barrier and adhesion layers, such as Ti, TiN, TiW or Ta, TaN), within the trenches thus created in order to contact electrically the electrodes 6a, 6b. A subsequent patterning step leads to formation of conductive paths 33, 35 that enable access to the bottom electrode 6a and to the top electrode 6b, respectively, to enable electrical biasing thereof during use. It is moreover possible to form further passivation layers (e.g., $SiO_2$ or SiN layers, not illustrated) for protecting the conductive paths 33, 35. One or more electrical-contact regions (not illustrated) may likewise be formed in the substrate 32 (e.g., by implantation of dopant species), electrically coupled to the conductive paths 33, 35.

Then (FIG. 3B), a step is carried out of deposition, on the wafer 30, of a structural layer 38 of dielectric or oxide material (here, for example, TEOS), with a thickness comprised between 2 and 5 µm. In particular, the structural layer 38 covers both the passivation layer 18 and the conductive paths 33, 35 completely.

A step of planarization of the structural layer 38 is then carried out to reduce the thickness and planarize the surface thereof. Following upon the planarization step, the structural layer 38 still has a thickness such as to cover completely both the passivation layer 18 and the conductive paths 33, 35, for example a thickness comprised between 0.3 µm and 1 µm (measured along Z starting from the top surface 32a of the substrate 32).

Then (FIG. 3C), a wafer-to-wafer bonding step is carried out to bond the passivation layer 18 of the wafer 30 mechanically to a further wafer 40, which includes a substrate 42. The substrate 42 is, like the substrate 32, of semiconductor material, for example silicon.

The materials of the passivation layer 18 and of the substrate 42 are therefore chosen so as to enable said bonding step, according to any one of the technologies available.

An annealing step at a temperature of between 300° C. and 400° C. improves adhesion between the silicon of the substrate 42 and the oxide of the layer 38.

Figure 3D:
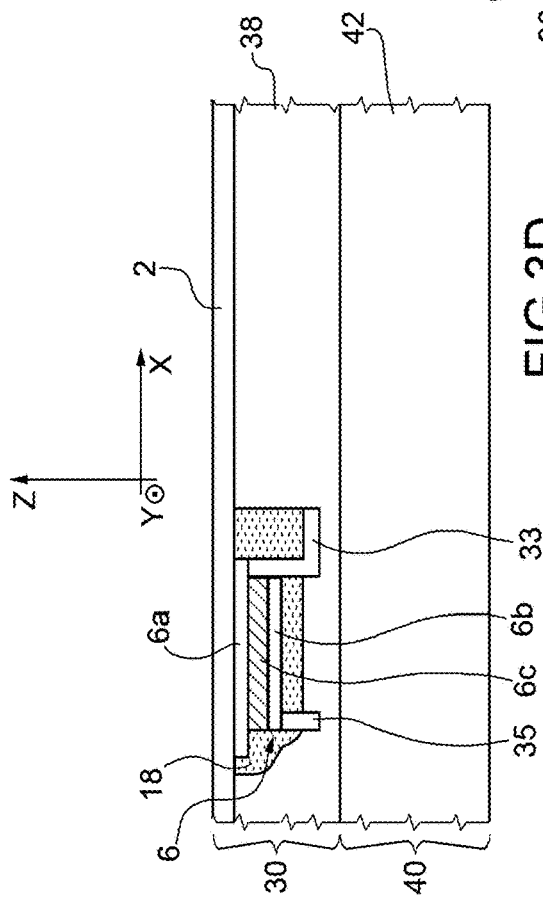

Next (FIG. 3D), the substrate 32 is thinned out with a grinding operation or some other technique suitable for the purpose. The substrate 32 will form, following upon the subsequent manufacturing steps, the suspended structure (cantilever) 2 of FIG. 1. Consequently, the thinning-out step of FIG. 3D is carried out so as to reach a final thickness (along Z) equal to the thickness that is desired or established in the design stage for the suspended structure 2 (e.g., between 0.5 µm and 100 µm).

Figure 3E:
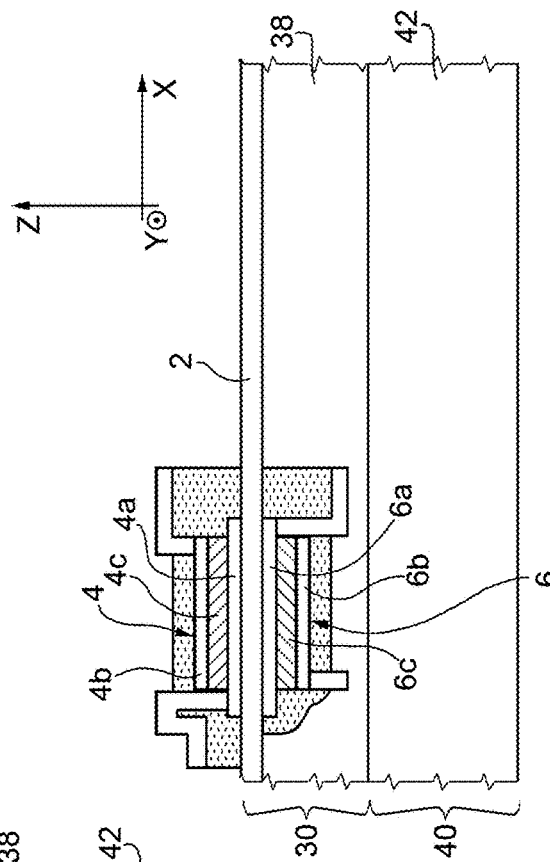

The first transducer 4 is then formed (FIG. 3E). The manufacturing steps for producing the first transducer 4 correspond to those already described for the second transducer 6 with reference to FIG. 3A and consequently will not be described any further herein.

Figure 3F:
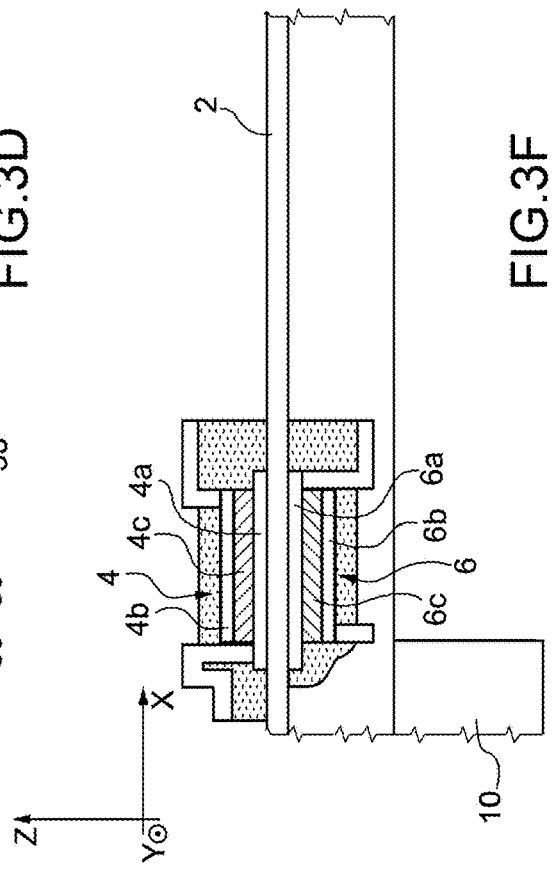
Figure 3G:
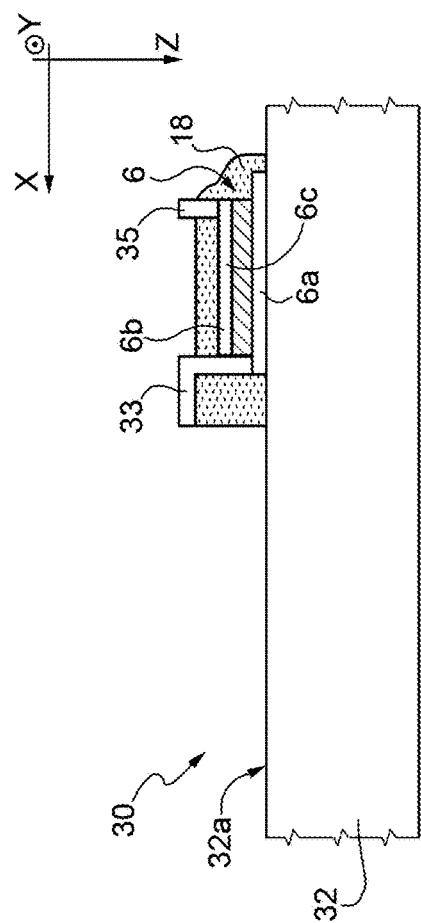

With reference to FIG. 3F, the substrate 42 is etched. Following upon this etching step, the substrate 42 is selectively removed so as to form the first structural region 10 of FIG. 1. In other words, the substrate 42 is removed except for one or more portions, the shape of which is chosen according to need, in particular for the purpose of supporting and sustaining the suspended structure 2.

Then (FIG. 3G), a selective etching of the structural layer 38 enables release of the suspended structure 2, which is now free to move. The type of etching process adopted for of the structural layer 38 is, for example, a wet-etching process (e.g., using HF) in the case where the layer 38 is of silicon oxide. The etching process proceeds at a higher rate in the direction Z than in the direction X. By monitoring the etching time, it is thus possible to stop etching when the structural layer 38 has been completely removed from the suspended structure 2 where this, in use, is required to deflect, and to keep a portion of the structural layer 38 in the first structural region 10, thus forming the second structural region 12 of FIG. 1.

The MEMS device 1 of FIG. 1 is thus obtained.

It is evident that the process steps described with reference to FIGS. 3A-3G may be used for forming, on a same wafer, a plurality of MEMS devices 1. Likewise, even though steps for formation of a cantilever have been described, similar steps can be implemented, in a way in itself evident, to form a membrane provided with circular piezoelectric transducers according to FIG. 2A, or with four piezoelectric stacks (four transducers) according to FIG. 2B.

Second Embodiment (Manufacturing Method)

Reference is made to FIGS. 4A-4D. The reference numbers used in FIGS. 4A-4D correspond to the ones already used in FIG. 1, and/or in FIGS. 3A-3G, where said reference numbers identify elements that are common to those of FIG. 1 and/or of FIGS. 3A-3G.

Figure 4A:
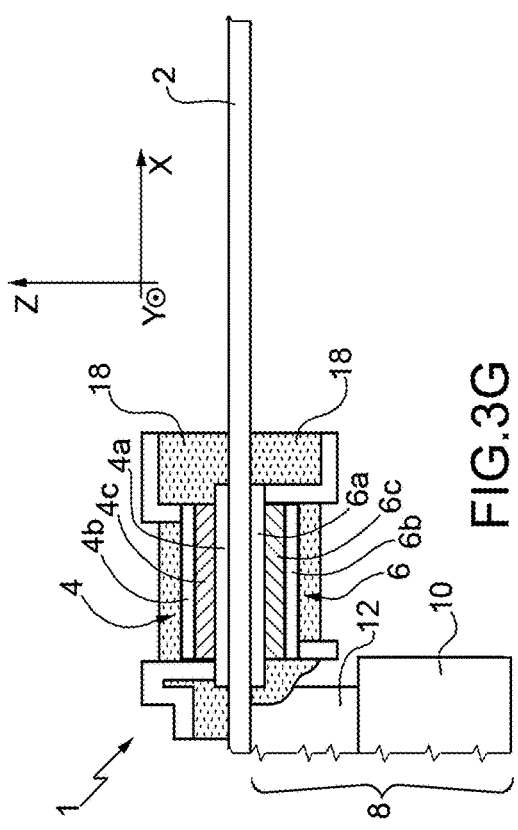
FIGS. 4A-4D illustrate manufacturing steps for producing the transducer producing of FIG. 1 according to a further embodiment of the present disclosure.
Figure 4B:
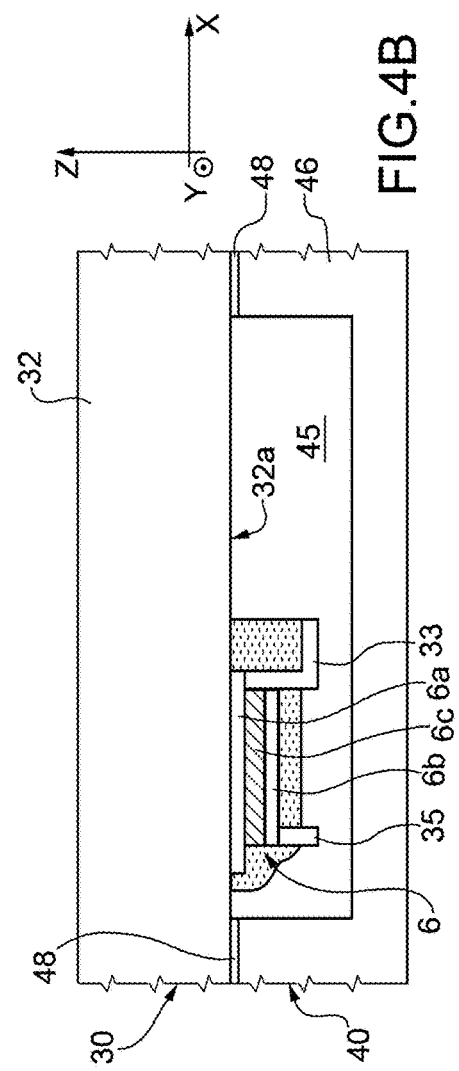

With reference to FIG. 4A, the manufacturing steps already described with reference to FIG. 3A are carried out and will therefore not be described any further. The same reference numbers are likewise used.

Next (FIG. 4B) a further wafer 40, including a substrate 42, is machined via micromachining steps to form a recess 45 therein having a depth such as to house, when coupled to the wafer 30, the second transducer 6. A cap-structure 46 is thus formed adapted to be coupled to the wafer 30 alongside the second transducer 6 and so that the recess 45 completely houses the second transducer 6.

Alternatively, the cap-structure 46 may be acquired from other sources.

The wafer 40 is coupled to the wafer 30 by known bonding techniques. For instance, in one embodiment, both the substrate 32 of the wafer 30 and the substrate 42 of the wafer 40 are of silicon. In this case, the bonding step is obtained by forming, on the surface of the wafer 40, a silicon-oxide layer 48 (for example, by thermal oxidation or deposition). Next, bonding between the silicon-oxide layer 48 thus formed and the silicon of the substrate 32 is carried out. An annealing step at a temperature of between 300° C. and 400° C. enables stabilization of the coupling.

Figure 4C:
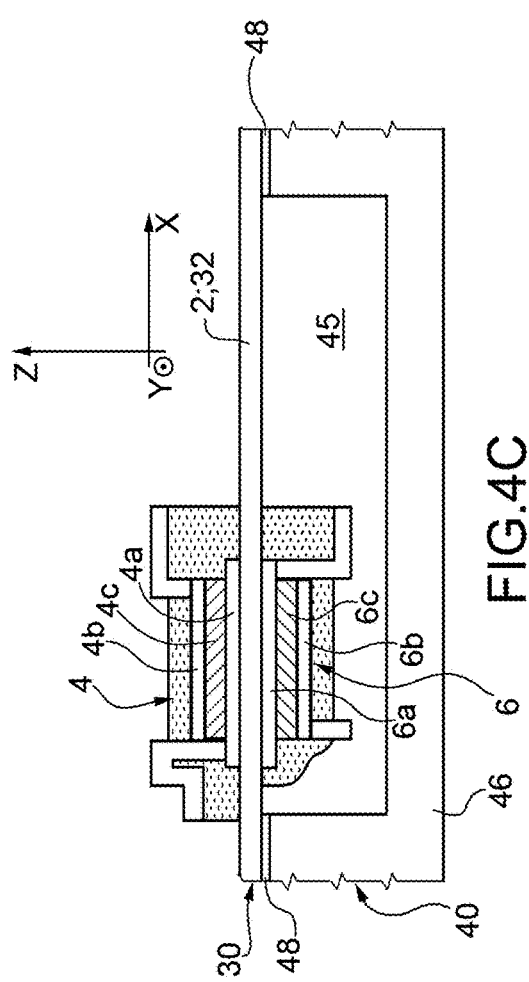

Then (FIG. 4C), the substrate 32 is thinned out by a grinding operation or some other technique suitable to the purpose. The substrate 32 will form, following upon the subsequent manufacturing steps, the suspended structure 2 of FIG. 1 (cantilever). Consequently, the thinning-out step of FIG. 4C is carried out so as to reach a final thickness (along Z) of the substrate 32 equal to the thickness that is desired or established in the design stage for the suspended structure 2 (e.g., of between 0.5 μm and 200 μm).

Next, on the thinned-out substrate 32 (in particular, on the surface of the latter opposite to the surface that houses the second transducer 6), the first transducer 4 is formed. Also in this case, the manufacturing steps for obtaining the first transducer 4 are similar to those already described previously, with reference to FIG. 3A, and consequently are not described any further in so far as they are in themselves evident.

Next (FIG. 4D), the cap 46 is subjected to a lapping, or grinding, step to reduce its thickness along Z and render the first transducer fluidically accessible (the fluid may, for example, be air).

Figure 4D:
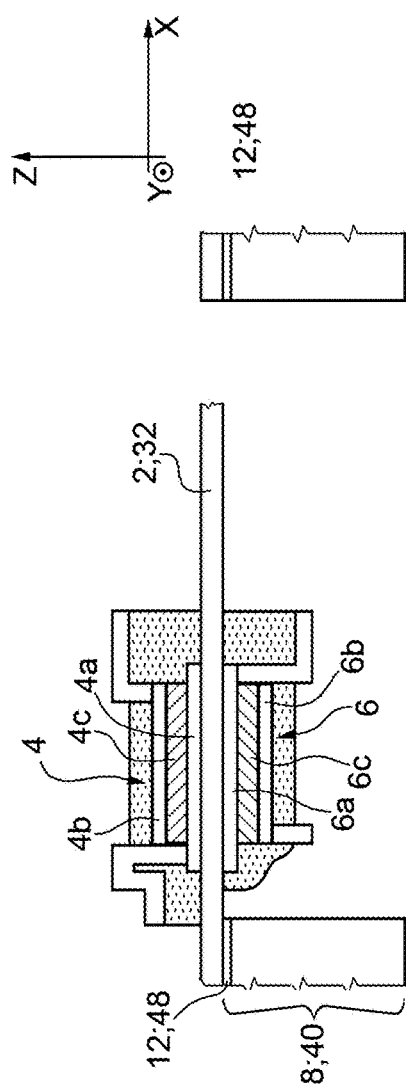

The step of FIG. 4D may be omitted, or else the cap 46 may be perforated so as to reduce contamination of the second transducer 6 from particulate matter, dust, or other contaminants present in the environment where the device is to be used.

Further masked-etching steps can be carried out to define a desired shape for the suspended structure 2.

The suspended structure 2 may be selectively etched, to form a cantilever, or else kept in the form of a membrane suspended on the remaining portions of the cap 46.

There is thus formed the MEMS device 1 of FIG. 1 or the device 20' of FIG. 2A (according to the shape chosen in the design stage for the piezoresistive transducers 4, 6 and to whether it is chosen to form a cantilever or a membrane). Alternatively, by forming the suspended structure so that it is of a membrane type and forming the other piezoresistive transducers 24, 26 (in a way in itself evident and during the same manufacturing steps for obtaining the transducers 4 and 6, respectively), the device 20'' of FIG. 2B is obtained.

This embodiment presents the advantage, over that of FIGS. 3A-3G, of not envisaging a step of release of the suspended structure 2 by wet etching (removal of the layer 38), and therefore there is an increase in the compatibility of the manufacturing process with other materials that could being present on the wafer 30 and that might get damaged by wet etching.

Third Embodiment (Manufacturing Method)

Reference is made to FIGS. 5A-5F. The reference numbers used in FIGS. 5A-5F correspond to the ones already used in FIG. 1, and/or in FIGS. 3A-3G, where said reference numbers identify elements that are common to those of FIG. 1 and/or of FIGS. 3A-3G.

FIGS. 5A-5F refer to the manufacture of a MEMS device that includes a membrane suspended structure, which, for example, can be used as lens for autofocus applications.

With reference to FIG. 5A, a wafer 60 is provided including: a substrate 62 (for example, of semiconductor material such as silicon); and an intermediate layer 63 (for example, of dielectric or insulating material such as silicon oxide), which extends over a top surface 62a of the substrate 62. The intermediate layer 63 has a thickness comprised, for example, between 0.1 μm and 1 μm.

On the intermediate layer 63 steps are carried out for formation of a piezoelectric stack 65 of a transducer 66, in a way similar to what has been described with reference to FIG. 3A, the stack including: a bottom electrode 66a, a top electrode 66b, and a piezoelectric layer 66c interposed between the bottom electrode 66a and the top electrode 66b.

Simultaneously with formation of the piezoelectric stack 65, likewise formed are electrical-contact structures 68, 69 for biasing of the top electrode 66b and bottom electrode 66a; these electrical-contact structures 68, 69 extend alongside the piezoelectric stack 65. The electrical-contact structure 68 includes a conductive pad, which is formed simultaneously with the bottom electrode 66a and is electrically connected to the bottom electrode 66a by conductive paths (not illustrated in the figure). The electrical-contact structure 69 includes a stack similar to the piezoelectric stack 65 and formed at the same time as the latter. In other words, the electrical-contact structure 69 comprises a bottom conductive pad 69a formed simultaneously with the bottom electrode 66a, a top conductive pad 69b formed simultaneously with the top electrode 66b, and an intermediate piezoelectric layer 69c formed simultaneously with the piezoelectric layer 66c. The top electrode 66b of the transducer 66 is electrically coupled (in a way not illustrated in the figure) to the top conductive pad 69b of the electrical-contact structure 69. A step is then carried out for formation of a passivation layer 72 (for example, of dielectric or insulating material), which completely covers the piezoelectric stack 65 and the electrical-contact structures 68 and 69.

An electrical contact 70 is then formed between the top conductive pad 69b and the bottom conductive pad 69a, to connect the two conductive pads 69a, 69b electrically together. Formation of the electrical contact 70 includes the steps of opening, through the passivation layer 72, access trenches towards both of the conductive pads 69a, 69b. For this connection, both of the conductive pads 69a, 69b are, in use, biased at the same potential, and consequently the piezoelectric layer 69c is not used as actuator.

Next (FIG. 5B), a step of deposition of a structural layer 76 is carried out. This layer will form, as discussed in relation to subsequent manufacturing steps, a suspended structure (similar to the structure 2 of FIG. 2A/2B) actuated by the piezoresistive transducers; in one embodiment, the structural layer 76 implements the lens for autofocus applications.

Formation of the structural layer 76 comprises, in one embodiment, the following steps: deposition of a material suitable for the specific application, for example BPSG/USG in the case of manufacture of a lens, using CVD, until the passivation layer 72 is completely covered (e.g., reaching a thickness comprised between 2 μm and 22 μm); and planarization of the material thus deposited by CMP (Chemical-Mechanical Polishing), to reduce the thickness thereof and planarize the surface (reaching a final thickness comprised between 1 μm and 20 μm).

Next (FIG. 5C), a step of wafer-to-wafer bonding is carried out, for coupling the structural layer 76 mechanically to a further wafer 80, which includes a substrate 82. This step basically corresponds substantially to what has been described with reference to FIG. 3C. The substrate 82 is, for example, of semiconductor material, such as silicon. The materials of the structural layer 76 and of the substrate 82 are chosen so as to enable execution of said bonding step, according to any of the technologies available. An annealing step at a temperature of between 300° C. and 400° C. improves adhesion between the silicon of the substrate 82 and the oxide of the layer 76.

Next (FIG. 5D, the substrate 62 is completely removed by grinding techniques to leave a small thickness of silicon and an etching of an etch-blanket-dry-type for removal of the remaining silicon, thus exposing the intermediate layer 63.

Figure 5E:
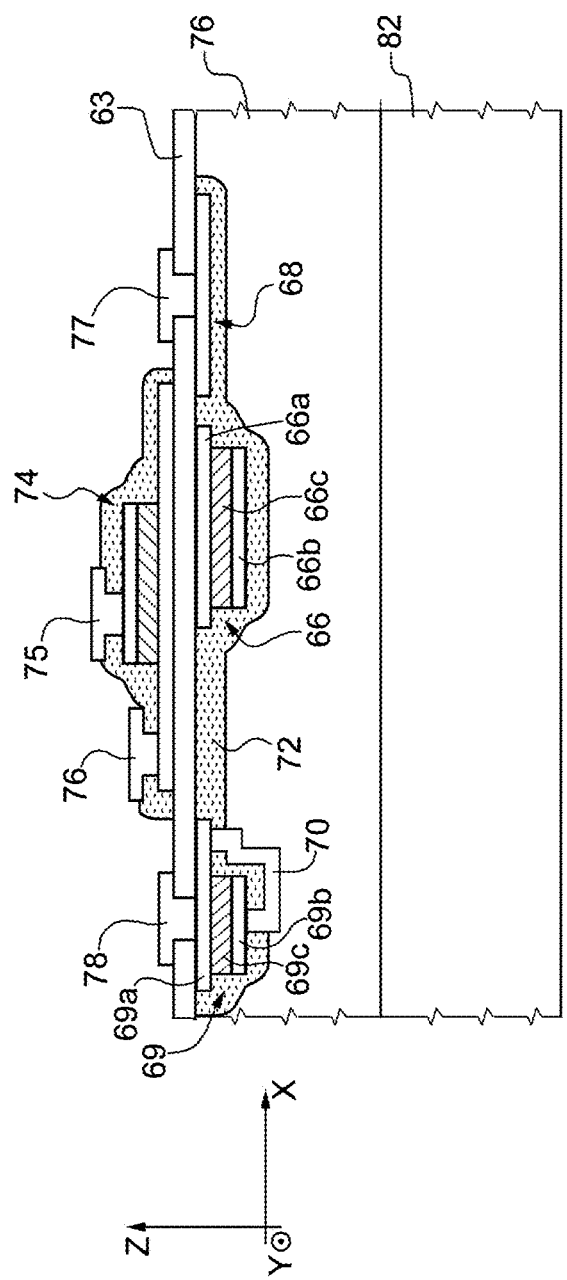

This is followed (FIG. 5E) by formation of a further transducer 74 on the exposed surface, in the step of FIG. 5D, of the intermediate layer 63. The steps for manufacturing the transducer 74 correspond to those already described previously, for example for formation of the first transducer 4 of FIG. 3A. The manufacturing steps also comprise formation of conductive paths 75, 76 for electrical access to the top and bottom electrodes of the transducer 74.

Furthermore, once again with reference to FIG. 5E, electrical access vias towards the electrical-contact structures 68 and 69 are formed by etching selective portions of the intermediate layer 63 at the electrical-contact structures 68 and 69. In particular, the intermediate layer 63 is etched to form a first access path towards the electrical-contact structure 68 and a second access path towards the bottom conductive pad 69a of the electrical-contact structure 69. This is followed by formation of the respective conductive paths 77, 78, for example by deposition of metal material. It may be noted that, since the bottom conductive pad 69a is electrically connected to the top conductive pad 69b, which is in turn electrically coupled to the top electrode 66b of the transducer 66, this embodiment enables electrical access to all the electrodes of both of the transducers 74 and 66 on a same side of the device.

Formation of the electrical-access paths towards the electrodes of the transducer 74 and of the transducer 66 may be carried out simultaneously (for example, in the case where the passivation layer that coats the transducer 74 is of the material that can be etched with the same etching chemistry that can be used for etching the intermediate layer 63). Likewise, also formation of the conductive paths 75, 76, 77, 78 may be carried out simultaneously.

Figure 5F:
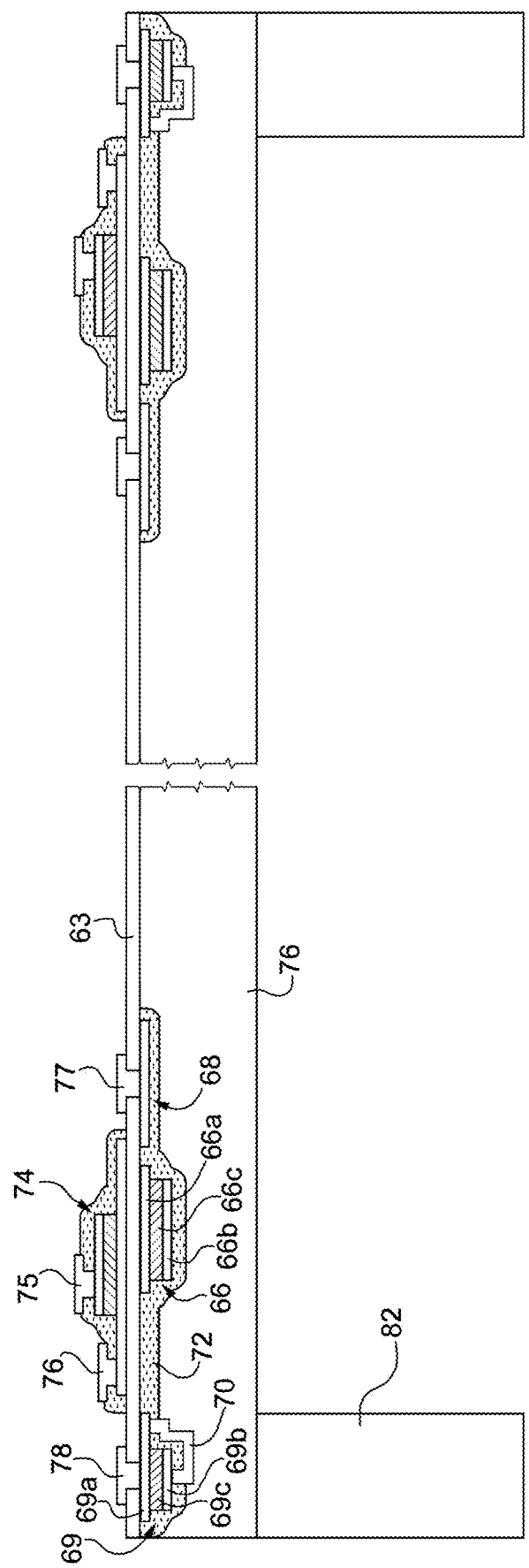

With reference to FIG. 5F, the substrate 82 is selectively etched, until the structural layer 76 is reached. In this way, the structural layer 76 is exposed and forms a suspended structure (of the membrane type), as illustrated in FIGS. 2A/2B and designated by the reference number 2. The etching mask used in this step is chosen and/or adapted according to the shape that it is desired to give to the suspended structure. In other words, the substrate 82 is removed except for one or more portions, the shape of which is chosen according to need, in particular for the purpose of supporting and sustaining the suspended structure.

Manufacturing steps in themselves evident may be carried out to form a plurality of piezoelectric transducers, for example four transducers, as illustrated in FIG. 2B, diametrally opposite relative to the geometrical center of the membrane formed.

The shape, number, and spatial arrangement of the electrical-contact structures 68, 69 in FIG. 5F are provided purely by way of example, and said electrical-contact structures 68, 69 may be formed in any region of the wafer or of the device that is being manufactured according to design choices that depart from the context of the present disclosure.

The present disclosure, in all the previous embodiments described and illustrated, can be applied to a wide range of technical sectors and used in a wide range of applications.

Figure 6B:
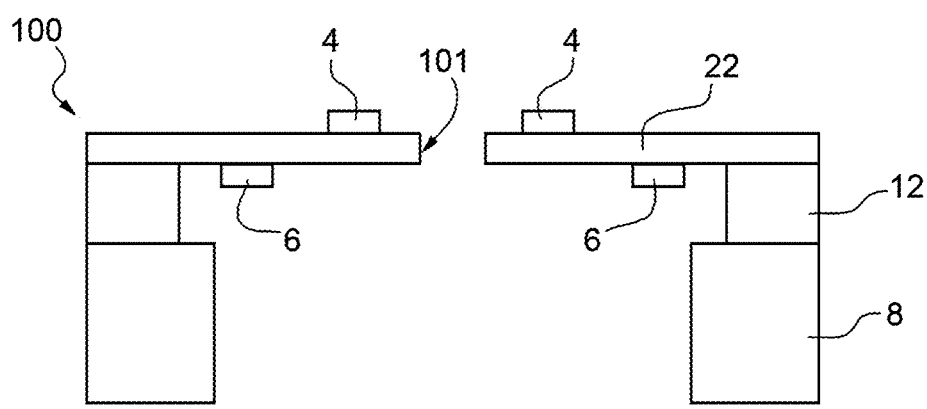

FIG. 6A shows a top view of a portion of a PMUT 100. FIG. 6B illustrates a cross-sectional view of the PMUT 100 (FIG. 6B is taken along the line of section VI-VI of FIG. 6A).

The PMUT 100 comprises (where possible, the same reference numbers as those of FIG. 2A are used for ready reference) the membrane 22, supported by a solid body 8 and optionally provided with a central hole 101, and two transducers 4 and 6. As may be noted from FIG. 6A, both the transducer 4 and the transducer 6 have a circular shape. Moreover, the first and second transducers 4 and 6 are not specular with respect to one another relative to the membrane 22. In fact, in order to maximize at the same time deformation of the membrane 22 during emission and optimize detection of the signal received, an aspect of the present disclosure envisages forming the first transducer 4 in the proximity of the geometrical center of the membrane, where deformation is maximum, and forming the second transducer 6 in the proximity of the bonding region between the membrane 22 and the solid body 8, so as to impress on the membrane 22 the maximum deflection during emission.

In addition, according to a further aspect of the present disclosure, the first transducer 4 is manufactured using AlN as material of the respective piezoelectric layer, whereas the second transducer 6 is manufactured using PZT as material of the respective piezoelectric layer. In fact, AlN presents the advantage that it can be used as very effective sensing material, whereas PZT presents the advantage that it has a higher performance in terms of actuation. It is thus possible to exploit to the full the peculiarities of the various materials.

In use, when an a.c. current/voltage is supplied to the top electrode 6b and the bottom electrode 6a of the transducer 6 in order to activate the piezoelectric 6c, a deflection of the membrane 22 along Z is generated.

As has been said, the PMUT 100 is able to function both as transmitter and as receiver. As transmitter, the electrical field between the top electrode 6b and the bottom electrode 6a generates a transverse stress in the piezoelectric 6c on account of the reverse piezoelectric effect. The stress thus generated causes a bending moment that forces the membrane to deflect out of the plane XY, thus generating a variation of pressure in the environment in which the PMUT 100 is inserted, which propagates as pressure wave in the medium considered. As receiver, an incident pressure wave causes a deflection of the membrane 22 and creates a transverse stress that results in a variation of electrical charge between the top electrode 4b and the bottom electrode 4a of the transducer 4 on account of the piezoelectric effect.

FIGS. 6A and 6B illustrate purely by way of example a single PMUT 100; however, in order to emit an ultrasound wave with specific directivity and distance of propagation, it is possible to produce an emitter device including a 2D array or a 1D array (in general an array) of PMUTs 100 organized according to a specific pattern, for example a circular or linear pattern.

Other applications are possible, for example for manufacturing MEMS speakers, micro-mirrors, etc.

Figure 7:
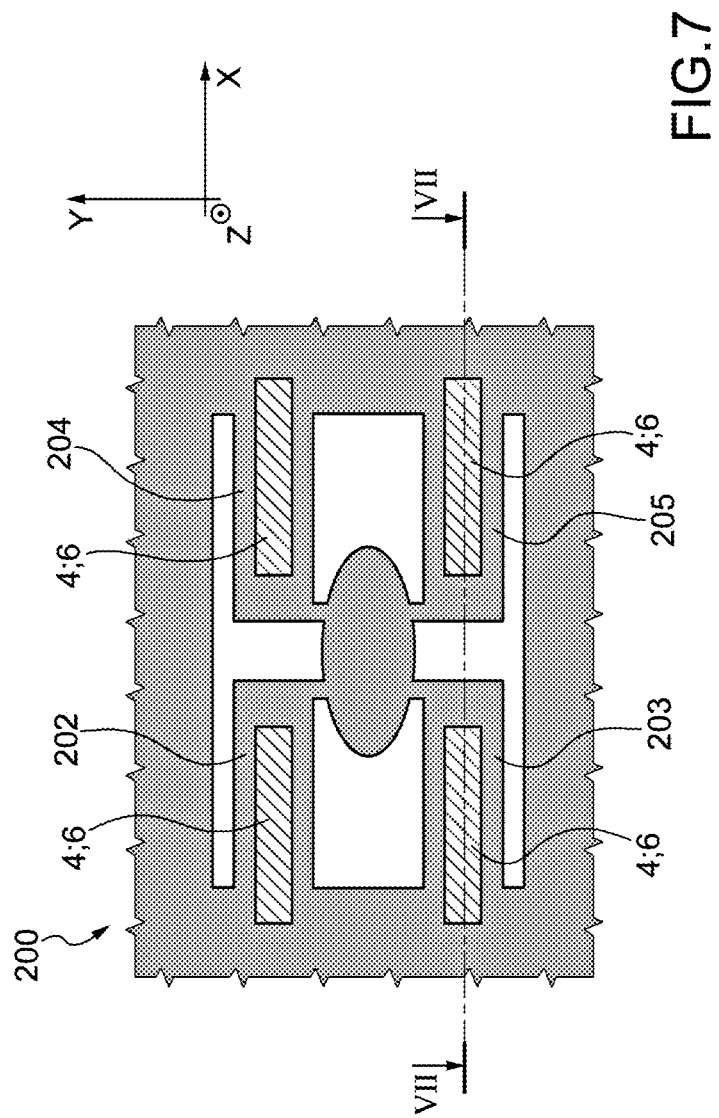
FIG. 7 is a top view of a micro-actuated mirror including a plurality of transducers of the type illustrated in FIG. 1.

By way of example, FIG. 7 is a schematic illustration (in top view) of a piezoelectric-actuation micromirror 200, provided with four actuation arms 202-205, each arm being provided in turn with two piezoelectric transducers (opposite to one another along Z) that operate as actuators for generating a deflection of the respective arm 202-205.

Each arm 202-205 has, in cross-sectional view along the line of section VII-VII of FIG. 7, a cantilever shape, substantially corresponding to the view of FIG. 1, and comprises (using the same reference numbers of FIG. 1) a respective first transducer 4 and a respective second transducer 6 coupled to surfaces, opposite to one another along Z, of each respective arm 202-205.

The advantages afforded by the disclosure according to the present disclosure, in the respective embodiments and according to the respective manufacturing methods, are evident from what has been described previously.

In particular, the present disclosure enables the possibility of deflecting a suspended structure in both directions, according to which transducer/actuator is actuated.

In addition, it is possible to compensate for any residual stresses deriving from the process for manufacturing the suspended structure by biasing a piezoelectric transducer with a voltage such as to generate a deflection of the suspended structure that is able to compensate the stress. The other transducer can be actuated for deflecting the suspended membrane according to what is envisaged by the specific application. In this way, the intrinsic stress in a state of rest of the suspended structure is effectively compensated. The production process is consequently simplified.

By appropriately choosing the type of piezoelectric material, it is likewise possible to exploit as much as possible the intrinsic characteristics of this material, for example as described in the case of FIGS. 6A/6B.

Finally, it is clear that numerous modifications and variations may be made to the device described and illustrated herein, all of which fall within the inventive scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transducer, comprising:
   a supporting body including:
      a first structural region having a first sidewall; and
      a second structural region including a second sidewall spaced outward from the first sidewall;
   a suspended structure, mechanically coupled to the supporting body, having a first and a second surface opposite to one another along an axis transverse to the first and second surfaces;
   a recess defined by the first structural region, the second sidewall of the second structural region, and the second surface of the suspended structure;
   a first piezoelectric transducer on the first surface of the suspended structure; and
   a second piezoelectric transducer on the second surface of the suspended structure, the second piezoelectric transducer is at least partially within the recess.

2. The transducer according to claim 1, wherein the first piezoelectric transducer includes a first stack having a first electrode, a second electrode, and a first piezoelectric layer between the first electrode and the second electrode, and the second piezoelectric transducer includes a second stack having a third electrode, a fourth electrode, and a second piezoelectric layer interposed between the third and fourth electrodes,
   wherein the first and second piezoelectric layers of the first and the second piezoelectric transducers, respectively, include at least one of: aluminum nitride, PZT, niobium-doped PZT, scandium-doped aluminum nitride, KNN, BaTiO3, or PZT-Mn.

3. The transducer according to claim 1, wherein the first and the second piezoelectric transducers are arranged symmetrically with respect to one another relative to a plane of symmetry parallel to the first and to the second surface and passing through a geometrical center of the suspended structure.

4. The transducer according to claim 1, wherein the first and the second piezoelectric transducers are arranged staggered with respect to one another relative to a plane of symmetry parallel to the first surface and to the second surface and passing through a geometrical center of the suspended structure.

5. The transducer according to claim 1, wherein at least one of the first piezoelectric transducer or the second piezoelectric transducer is arranged at a region of actuation of the suspended structure at which actuation of the at least one of the first or second piezoelectric transducers maximizes deflection of the suspended structure along an oscillation direction.

6. The transducer according to claim 5, wherein the suspended structure is of a cantilever type having a first end coupled to the supporting body and a second end free to oscillate in the oscillation direction, the actuation region being in the proximity of the first end.

7. The transducer according to claim 5, wherein the suspended structure is of a membrane type having an edge region at least partly constrained to the supporting body and a central region, surrounded by the edge region, free to oscillate in the oscillation direction, the actuation region extending in the proximity of the edge region.

8. The transducer according to claim 1, wherein at least one of the first or second piezoelectric transducers is arranged in a detection region of the suspended structure, the detection region configured to be subjected to a maximum deformation when the suspended structure deflects in response to a force external to the transducer.

9. The transducer according to claim 8, wherein the suspended structure is of a cantilever type having a first end coupled to the supporting body and a second end free to oscillate in an oscillation direction, the detection region being in the proximity of the second end.

10. The transducer according to claim 8, wherein the suspended structure is of a membrane type having an edge region at least partly constrained to the supporting body, and a central region, surrounded by the edge region, that is free to oscillate along the oscillation direction, wherein one of the first or second piezoelectric transducers is arranged at the detection region at a distance from the edge region that is greater than the distance at which the other of the first or second piezoelectric transducers is arranged from the edge region.

11. A MEMS device, comprising:
a support;
a suspended structure coupled to the support, the suspended structure having a first surface and a second surface opposite to one another;
a first piezoelectric transducer on the first surface of the suspended structure, the first piezoelectric transducer includes a first electrode on the first surface, a first piezoelectric material on the first electrode, and a second electrode on the first piezoelectric material, the first electrode extends past a first sidewall of the first piezoelectric material; and
a second piezoelectric transducer on the second surface of the suspended structure, the second piezoelectric transducer includes a third electrode on the second surface, a second piezoelectric material on the third electrode, and a fourth electrode on the second piezoelectric material, the third electrode extends past a second sidewall of the second piezoelectric material.

12. The MEMS device according to claim 11, wherein the MEMS device includes at least one of: a Piezoelectric Micromachined Ultrasonic Transducer (PMUT), a micromirror, a microphone, a speaker, a printhead, or micropumps.

13. The MEMS device according to claim 11, wherein:
the first piezoelectric transducer is configured to deflect the suspended structure in a first direction transverse to the first and second surfaces; and
the second piezoelectric transducer is configured to deflect the suspended structure in a second direction opposite to the first direction.

14. The MEMS device according to claim 11, wherein the first piezoelectric transducer overlaps the second piezoelectric transducer.

15. The MEMS device according to claim 11, wherein the first piezoelectric transducer is offset relative to the second piezoelectric transducer.

16. The MEMS device according to claim 11, wherein the suspended structure is a cantilever type having a first end coupled to the support and a second end free to oscillate.

17. The MEMS device according to claim 11, wherein the suspended structure is a membrane type having an edge region at least partly constrained to the support and a central region, surrounded by the edge region, free to oscillate.

18. A MEMS device, comprising:
a supporting body;
a membrane structure mechanically coupled to the support body, the membrane structure having a first surface and a second surface opposite to the first surface, and the membrane structure is configured to move in a first direction transverse to the first and second surfaces and to move a second direction opposite to the first direction;
a first piezoelectric transducer on the first surface of the membrane structure, the first piezoelectric transducer including one or more first sidewalls;
a second piezoelectric transducer on the second surface of the membrane structure, the second piezoelectric transducer overlaps the first piezoelectric transducer, the second piezoelectric transducer including one or more second sidewalls;
a third piezoelectric transducer on the first surface of the membrane structure, the third piezoelectric transducer includes one or more third sidewalls; and
a fourth piezoelectric transducer on the second surface of the membrane structure, the fourth piezoelectric transducer overlaps the third piezoelectric transducer, the fourth piezoelectric transducer includes one or more fourth sidewalls; and
at least one passivation material covers the first piezoelectric transducer, the second piezoelectric transducer, the third piezoelectric transducer and the fourth piezoelectric transducer, and the at least one passivation material covers the one or more first sidewalls, the one or more second sidewalls, the one or more third sidewalls and the one or more fourth sidewalls.

19. The MEMS device according to claim 18, wherein the membrane structure includes a central region that extends from the first and second piezoelectric transducers to the third and fourth piezoelectric transducers.

20. The MEMS device according to claim 19, wherein the membrane structure includes an edge region that surrounds the central region and is mechanically coupled to the supporting body.

* * * * *